United States Patent [19]
McGregor et al.

[11] 4,098,370
[45] Jul. 4, 1978

[54] VIBRATION MASKING NOISE SYSTEM

[76] Inventors: Howard Norman McGregor, 6651 S. Wellington Ct., Littleton, Colo. 80121; Robert Charles Chanaud, 1708 Hillside Rd., Boulder, Colo. 80302

[21] Appl. No.: 678,368

[22] Filed: Apr. 19, 1976

Related U.S. Application Data

[63] Continuation-in-part of Ser. No. 595,671, Jul. 14, 1975, abandoned.

[51] Int. Cl.[2] .......... H05K 5/00
[52] U.S. Cl. .......... 181/150; 179/1.5 M
[58] Field of Search .......... 179/1 AA, 1.5 M, 181 W; 181/33 L, 150, 151, 199

[56] References Cited

U.S. PATENT DOCUMENTS

| | | | |
|---|---|---|---|
| 1,656,781 | 1/1928 | Dunn | 179/181 W X |
| 3,449,531 | 6/1969 | Ashworth | 179/181 W X |
| 3,609,253 | 9/1971 | Ashworth | 179/115.5 R |
| 3,985,200 | 10/1976 | Sepmeyer | 181/150 |
| 3,985,957 | 10/1976 | Torn | 179/1.5 M |

FOREIGN PATENT DOCUMENTS

| | | | |
|---|---|---|---|
| 49,024 | 12/1972 | Japan | 179/181 W |
| 1,420,201 | 1/1976 | United Kingdom | 179/1.5 M |

*Primary Examiner*—Lawrence R. Franklin
*Attorney, Agent, or Firm*—Burton & Dorr

[57] ABSTRACT

A vibration masking noise system for delivering masking noise into a room or building is designed to vibrate part of the building structure so that masking noise is extended into the room. The system includes a noise generator, a spectrum shaper for shaping the noise, an amplifier for amplifying the shaped noise and a transducer mechanically connected to the structure for converting the masking noise into vibrations of the structure.

7 Claims, 10 Drawing Figures

VIBRATION MASKING NOISE SYSTEM

CROSS-REFERENCE

This is a continuation-in-part of U.S. Ser. No. 595,671, filed July 14, 1975 now abandoned, by Robert Chanaud and Howard McGregor entitled "Vibration Masking Noise Device".

BACKGROUND OF THE INVENTION

1. Field of the Invention

The present invention relates generally to noise masking systems and more particularly to a noise masking system for extending masking noise into a room by vibrating a structural member thereof.

2. Description of the Prior Art

Noise masking systems installed for use in buildings, rooms, large open spaces, etc., are conventionally in use for providing a noise background containing a proper distribution of frequencies and amplitudes that effectively reduce interference associated with ambient background sound within the room. See, for example, W. J. Cavanaugh, et al, "Speech Privacy in Buildings," *The Journal of the Acoustical Society of America,* Volume 34, No. 4, April, 1962.

Most masking systems use conventional diaphragm speakers which are physically placed within the room at a plurality of predetermined locations. However, structural components such as beams, pipes, air conditioning ducts, etc. generally interfere with the mounting of diaphragm speakers on the ceiling of the room. Such speakers are not mounted on the walls due to the disruption of the aesthetic appearance of the room. In addition, such speakers are not mounted on the floor in the room due to the expense of usable floor space, and for other reasons.

None of the prior art masking systems use vibration of a structural member to inject the masking noise into the room. Prior art transducers which directly attach to the wall so that the wall is appropriately vibrated to a music or sound source, however, are known. Examples of such approaches are found in the patents issued to R. T. Cozart, U.S. Pat. No. 3,636,281 issued on Jan. 18, 1972; A. Komatsu, U.S. Pat. No. 3,728,497 issued on Apr. 17, 1973; and J. F. Cain, U.S. Pat. No. 3,311,712, issued on Mar. 28, 1967. While these prior art approaches generally produce omnidirectional sound emanating from the vibrated structural member, such prior art approaches are expensive to manufacture, not reliable in the field, generally require a great amount of energy to produce the desired sound transmission and exhibit the possibility of rattling at high or low frequencies or at high power conditions. Such conventional approaches, therefore, are generally not applicable to thick or massive structural members. For those types of members, the transducer body itself begins to vibrate excessively without transferring the vibratory energy thru the structural member.

In addition, due entirely to the nature of the structural member (such as a wall), a smooth frequency response is usually not obtainable over the normal frequency range of hearing. For example, in the patent issued to J. F. Cain, supra it is specifically mentioned that two units are desirable in order to provide the best frequency response over the normal hearing range. The above prior art transducers are not suitable for use in noise masking systems since noise masking systems operate day in and day out for the better part of each day thereby imparting considerable wear stress to the several components of the transducers.

The present invention avoids the problem of the prior art approaches in that a spectrum shaper is utilized to establish a desired sound distribution within the room by compensating for the particular transmission characteristics of the structural member being vibrated. The spectrum shaper of the present invention is adjusted to provide a substantially smooth response of masking noise within the room of desired spectrum shape. In addition, a conventional diaphragm speaker is utilized to impart vibration to the structural member having either a high or low mass. The use of conventional diaphragm speakers, as the vibration exciting transducer, results in a lower cost system exhibiting greater wear capabilities.

OBJECTS OF THE INVENTION

It is an object of this invention to provide a masking noise system which can vibrate structural members of a building.

It is another object of this invention to provide a noise masking system which can change both the frequency spectrum and the amplitude of the masking noise in order to compensate for the frequency response of a particular building structural member.

It is still a further object of the present invention to provide a noise masking system which can utilize a conventional diaphragm speaker for imparting vibration to a structural member of a building.

It is still a further object of the present invention to provide a noise masking system for delivering masking noise into a room wherein the noise masking system generates masking noise, shapes both the frequency spectrum and the amplitude of the generated noise, and imparts vibration to a structural member by means of a diaphragm speaker for vibrating the building structure so that masking noise is generated omnidirectionally from the structural member.

SUMMARY OF THE INVENTION

The present invention includes a noise generator for producing masking noise, a spectrum shaper operative on the generated masking noise to selectively change the amplitude and the spectral density of the masking noise, an amplifier receptive of the shaped masking noise for amplifying the noise, a speaker interconnected with the amplifier and connected to a structural member of the building for converting the electrical masking noise signals into vibration of the member so that masking noise is omnidirectionally delivered into the building.

The speaker of the present invention is positioned so that the conical diaphragm is directed at the structural member in close parallel spaced relation thereto. The force of the compressed acoustical airwaves against the structural member emanating from the vibration of the diaphragm, in turn, causes the structural member to vibrate. Several different embodiments, using a speaker, are disclosed. In one embodiment, the speaker is enclosed in a rectangular baffle and is positioned in close parallel spaced relation away from the structural member. In another embodiment, a rod is positioned over the voice coil of the loudspeaker, upwardly through the opening diaphragm so that the other end of the rod is firmly affixed against the surface of the structural member. The affixing of the speaker against the rod and against the wall can be done in several approaches. In one approach adaptable for the separation space between adjoining walls of adjacent rooms, the length of the rod is selected so that when the base of the speaker opposing the diaphragm is mounted on one wall, the rod is affixed against the other wall of the adjacent room. In yet another approach adaptable for high mass structural members, the speaker and the rod are biased against each other and against the structural member by means of coil springs located around the periphery of the speaker. In these rod arrangements, vibration is imparted to the wall both from the acoustical force of the soundwaves from the speaker's diaphragm against the wall and by the inertia of the speaker's voice coil itself acting through the affixed rod. In yet another embodiment, a truncated cone member substantially corresponding to the shape of the diaphragm is affixed at its base to the structural member, the diaphragm of the speaker is then placed over the cone so that the surface of the cone is in close parallel relationship to the diaphragm. The air trapped between the speaker and the cone serves as a high spring constant spring to maximize the acoustical coupling between the speaker and the structural member.

Other objects, advantages and capabilities of the present invention will become more apparent as the description proceeds taken into conjunction with the accompanying drawings.

DESCRIPTION OF THE PREFERRED EMBODIMENT

Figure 1:
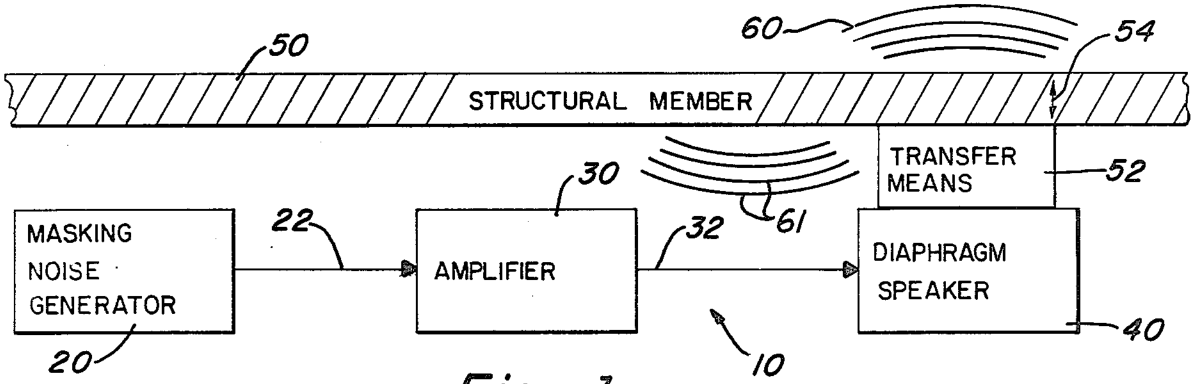
FIG. 1 is a diagrammatic representation of the various elements of the vibration masking system of the present invention.
Figure 2:
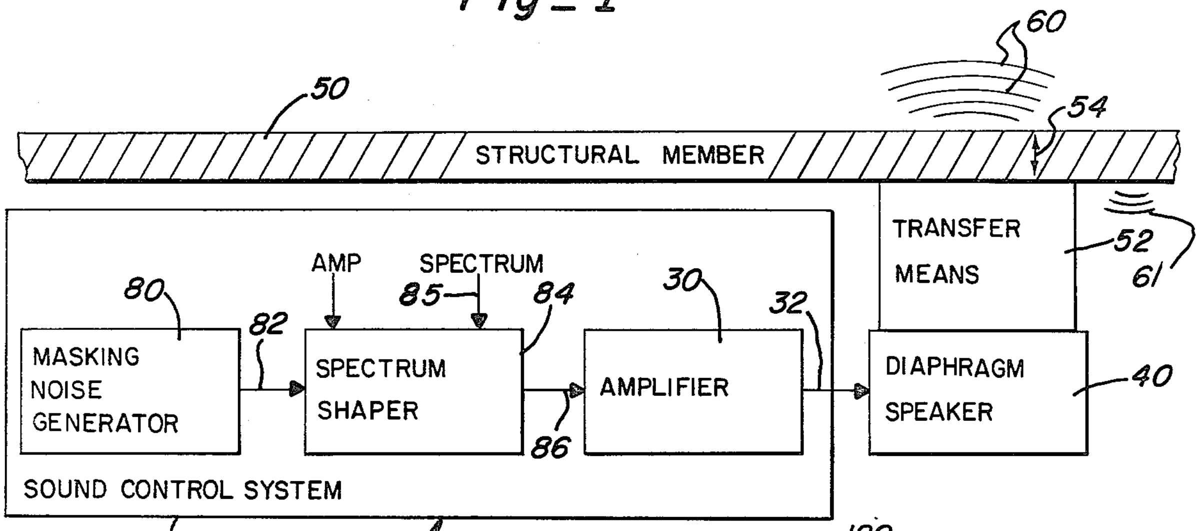
FIG. 2 is a diagrammatic representation of a second embodiment utilizing a spectrum shaper of the vibration masking system of the present invention.

In FIGS. 1 and 2 are shown two preferred arrangements of masking noise systems. In FIG. 1, the masking noise system 10 of the present invention includes a masking noise generator 20 for generating a signal of broad band spectrum electrical noise over lead 22, an amplifier 30 receptive of the electrical masking noise signal on lead 22 for amplifying the signal and for delivering the amplified signal over lead 32, a diaphragm speaker 40 responsive to the amplified signal on lead 32 for imparting vibration to a structural member 50 of a building through a transfer means 52. The structural member 50 vibrates in the direction of arrow 54 in order to produce omnidirectional acoustic waves 60 and 61.

The masking noise generator 20 is conventional and may be of the type manufactured by General Radio Company as Model 1381 and disclosed in the 1973 General Radio Catalog at page 82. The amplifier 30 is also conventional and may be any conventional audio amplifier. The diaphragm speaker 40 is also conventional and is preferably of the type manufactured by Soundolier, Inc., 9380 Watson Industrial Park, St. Louis, Mo., as Model Number C5T70. Of course, the amplifier 30 is provided with suitable amplitude control so that the masking noise as represented by acoustic wave 60 is preset to a desired level of amplitude which is aesthetically pleasing to users within the room.

The structural member 50 is shown in FIG. 1 to be a wall or partition of a room; however, the masking system of the present invention may find application on any of a number of conventional structural members such as, but not limited to, heating ducts, air conditioning ducts, walls, partitions, beam supports, floors, ceilings, etc.

In operation, the noise masking system of FIG. 1 generates masking noise in the generator 20 which is then amplified to a predetermined level by amplifier 30 for delivery into a diaphragm speaker 40. It is to be expressly understood that more than one speaker may be utilized in the present invention. As will be more thoroughly discussed in the ensuing, the diaphragm speaker 40 may comprise any of a number of diaphragm speaker arrangement in cooperation with any of a number of transfer means 52. Suffice it to say at this time, that the diaphragm speaker 40 responds to the masking noise electrical signal to generate in the transfer means 52 the means by which to vibrate the structural member 50. The structural member 50 while vibrating, extends the masking sound from the diaphragm speaker into the room in an omnidirectional fashion as represented by waves 60 and 61.

In FIG. 2 is shown a second embodiment for generating the masking noise. In the masking system 100 of FIG. 2, a sound control system 70 is provided. The sound control system 70 is preferably of the type disclosed and hereinafter specifically incorporated by reference in the following U.S. Pat. No. 4,052,720, issued Oct. 4, 1977 by Robert Chanaud and Howard McGregor entitled "Dynamic Sound Controller and Method Therefor". However, a conventional system for shaping may be used such as a General Radio 1925 Multifilter rather than the shaper of the incorporated reference.

The sound control system 70 disclosed in the above-stated co-pending application includes a masking noise generator 80 which extends random masking noise electrical signals over lead 82 into a spectrum shaper 84. Noise masking generator 80 corresponds to the noise generator 16 of FIG. 3 of the incorporated reference and spectrum shaper 84 corresponds to source modifier 18 and delivery modifier 22 of FIG. 1. The spectrum shaper automatically, in a predetermined cyclic fashion, varies the amplitude AMP and the spectral density 85 of the masking noise appearing on lead 82 and delivers this shaped noise over lead 86 into a conventional amplifier 30 as is used in FIG. 1. The amplified noise signal is delivered over lead 32, as before, into a diaphragm speaker 40 and transfer means 52 to cause a structural member 50 to vibrate in the direction of arrow 54 so that omnidirectional acoustic waves 60 and 61 are generated.

The advantage of the approach shown in FIG. 2 over the approach shown in FIG. 1 is primarily due to the fact that the structural member 50 causes what otherwise would be a smooth response of the masking noise 60 and 61 to be distorted due to the wave transfer characteristics of the structural member 50. Such distortion of transfer, however, can be substantially minimized by adjusting both the amplitude and the spectral density of the noise from the noise generator 80 to compensate for the distortion of the structural member 50. Thus, the amplified noise delivered over lead 32 to the diaphragm speaker 40 is of a sufficient frequency characteristic to compensate for the distortion of the structural member so that the generated masking noise 60 in the room is substantially smooth. In the teachings of the specifically incorporated co-pending application, the response 60 and 61 can be fully determined and measured by means of a sound level meter and the spectrum control 85 on the spectrum shaper 84 can be appropriately adjusted to compensate for the frequency characteristics of the structural member. Indeed, in the teachings of the incorporated application it may be highly desired to have a varied frequency response for the generated masking noise found within the room or building. The teachings of that co-pending application delineate the details by which the amplitude and spectral density of the noise can be adjusted to compensate for the frequency response of the structural member 50. It is to be understood that in a similar manner the frequency characteristics of the structural member 50 can be compensated for by appropriate tailoring of the controls of the spectrum shaper 84 according to the teachings of the incorporated co-pending application.

Figure 10:
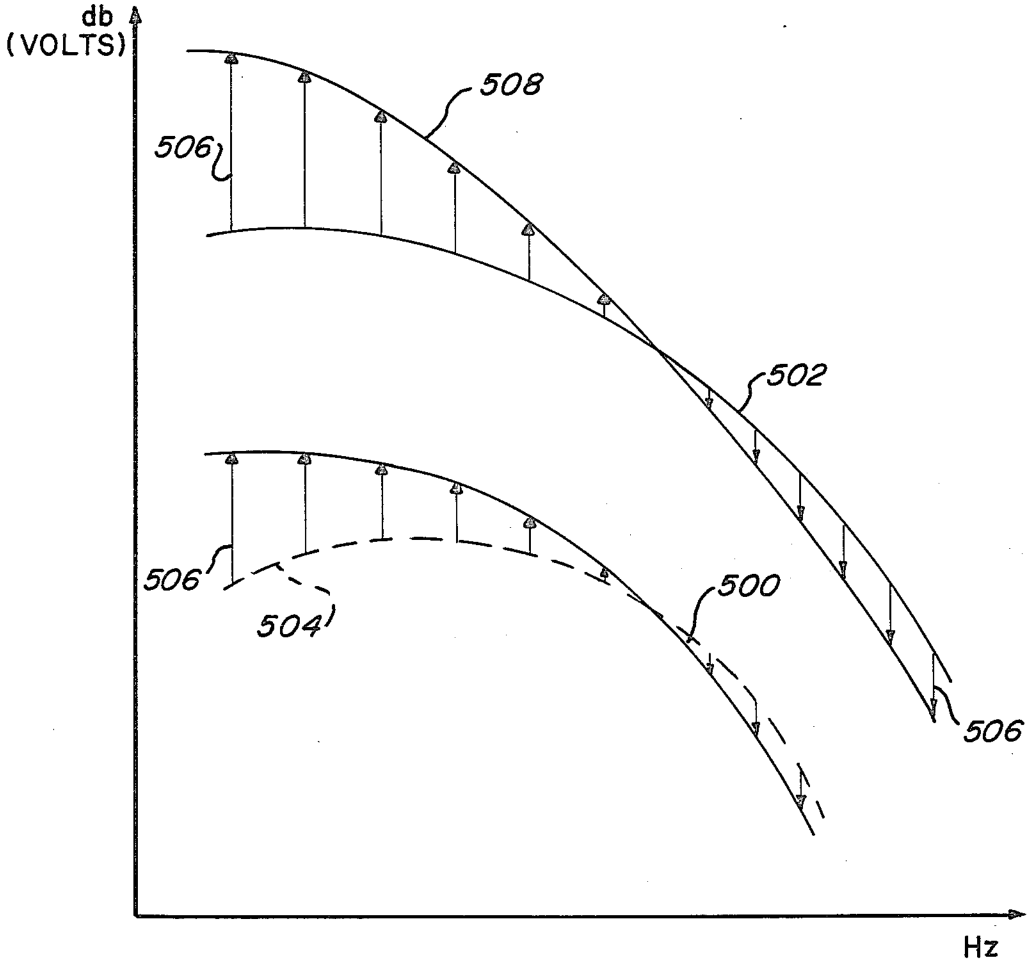
FIG. 10 is a graph of spectral distribution of a hypothetical room.

To further clarify the use of the spectrum shaper 84 in the teachings of this invention, a typical example is shown in FIG. 10. The desired spectral distribution and amplitude of the masking noise in the room is represented by curve 500. If the system of FIG. 1 is used, the signal delivered to the structural member 50, represented by curve 502, is of sufficient amplitude to vibrate the structural member with sufficient force to produce the desired amplitude of masking noise. Unfortunately, the transmission characteristics of the structural member are variable being wholly dependent on the physical make-up of the member. Therefore, the structural member may actually distort the masking noise in the room as shown by curve 504. By adjusting curve 502, in the manner taught by the incorporated reference, the response of the structural member can be compensated for as represented by arrows 506. The actual electrical signal delivered to the speaker is represented by curve 508.

Figure 3:
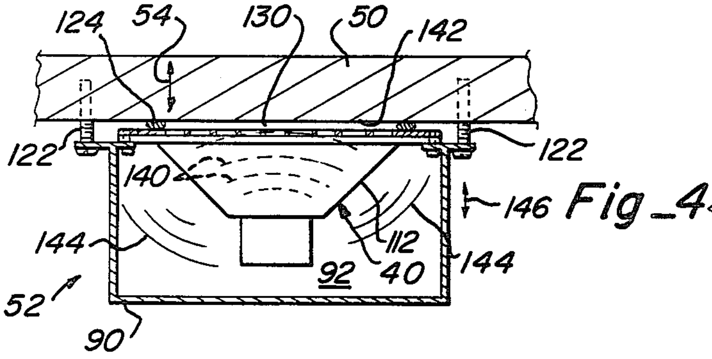
FIG. 3 is a sectional view illustrating one manner in which a diaphragm speaker may be interconnected with a structural member in accordance with the teachings of the present invention.
Figure 4:
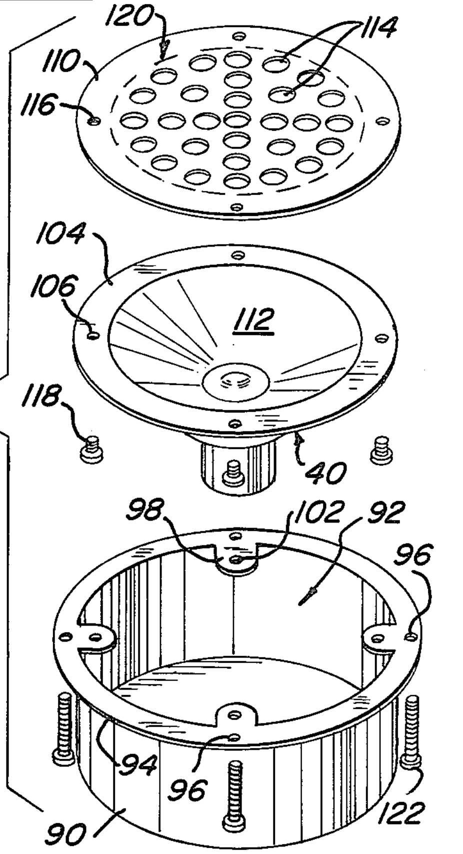
FIG. 4 is an exploded perspective view of the various parts of the arrangement shown in FIG. 3.

In FIGS. 3 and 4 are shown the details of one preferred embodiment of transfer means 52 and speaker 40. The speaker 40, as shown in FIG. 4, is positioned into a baffle or housing 9 which is substantially circular in shape and which defines an inner cavity portion 92 and an upper flange portion 94 having formed therein a plurality of attachment holes 96. In addition, a plurality of inwardly directed support lips 98 are formed protruding inwardly into the cavity 92 having attachment holes 102 formed therein. As shown in FIG. 3, the outer lip edge 104 of the speaker 40 rests on the protruding lips 98 so that corresponding attachment holes 106 line up with the formed holes 102. A screen or plate 110 corresponding in shape to the outer diameter of the lip region 104 of the speaker 40 is placed over the top of the speaker 40 to completely cover the diaphragm region 112. A plurality of holes 114 is formed in the surface of the screen plate 110 over the region of the speaker 40 containing the diaphragm 112. In addition, attachment holes 116 are formed in the screen or plate 110 to correspond and line up with attachment holes 106 and 102.

In this manner, the speaker 40 is mounted into the cavity 92 of the baffle 90 and the screen or plate 110 is placed over the speaker and attached thereto. The speaker is firmly connected to the housing by attachment to the inwardly protruding lips 98 by means of appropriate screw-like connectors 118.

An amount of silicon seal is placed in the region corresponding to the dotted line 120 of FIG. 4 and the housing 90 is now mounted to the structural member 50 by means of studs 122 which extend through holes 96 formed in the outer flange region of the baffle 90. As shown in FIG. 3, the silicon seal 124 becomes flattened out to completely seal the air 130 immediately above the screen plate 110 and immediately below the structural member 50 into the region defined by the upper surface of the diaphragm 112. The acoustic waves 140 primarily thrust upon the surface 142 and the air pressure created is substantially sealed within the air space 130. If the seal 124 were not provided, the acoustic wave would still cause the structural member 50 to vibrate but with less concentrated force due to the escape of the air pressure caused by the acoustic wave into the region outside of the baffle 190.

In addition, acoustic waves 144 which are generated by the diaphragm 112 into the cavity region 92 of the baffle 90 cause the baffle to vibrate. The vibration of the baffle 90, for example in the direction of arrow 146, is extended and transmitted into the structural member through fasteners 122. Thus, the vibration of the structural member 50 can be discerned to be from two separate sources. The first primary source is provided by the acoustic waves 140 directly impinging onto the surface 142 of the structural member 50 while the second source is from the interaction of the acoustical waves 144 impinging on the interior of the baffle 90 to cause the baffle 90 to vibrate which in turn is transmitted to the structural member 50 through fasteners 122. In addition, the provision of the housing or baffle 90 further prevents the transfer of the masking noise downwardly into an area where masking noise is not desired.

Figure 5:
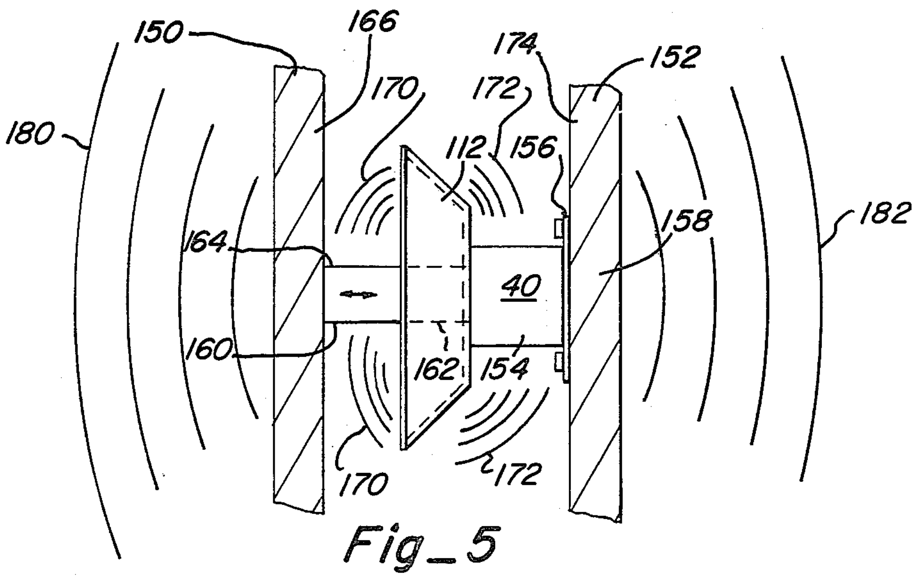
FIG. 5 is a side planar view of the speaker of the present invention engaging a rod of the present invention to impart vibration into two adjoining walls of adjacent rooms.

In FIG. 5, the speaker 40 is positioned between two structural members 150 and 152. The speaker 40 is mounted at the base of its voice coil 154 to a mounting plate 156 that is firmly attached to the structural member 152 by attachment studs. A rod 160 is cut so that one end 162 of the rod 160 is glued or otherwise affixed on the surface of the voice coil 154 adjacent to the diaphragm 112 as shown in FIG. 5 and so that the other end 164 of the rod is firmly glued or otherwise affixed to the inner surface 166 of the structural member 150. The rod 160 is preferably made of a material such as wood or the like that is capable of transmitting, without substantial distortion, audible sound waves. In this arrangement, acoustic waves 170 are generated from the diaphragm 112 of speaker 40 which impinge upon surface 166 to cause the structural member 150 to vibrate. In addition, acoustic waves 172 are generated rearwardly of the diaphragm 112 to impinge upon the surface 174 of the structural member 152 to cause structural member 152 to vibrate. Further, the vibrations of the voice coil are transmitted to both structural members 150 and 152. Through the inneraction of the mechanical vibration and acoustical waves, structural members 150 and 152 vibrate thereby creating omnidirectional acoustic waves of masking noise into the two separate rooms as represented by waves 180 and 182. The arrangement shown in FIG. 5 eliminates the requirement of providing two separate and costly speakers, one for each room. The application shown in FIG. 5 is suited for apartment complexes wherein rooms are separated by a barrier of separation space.

Figure 6:
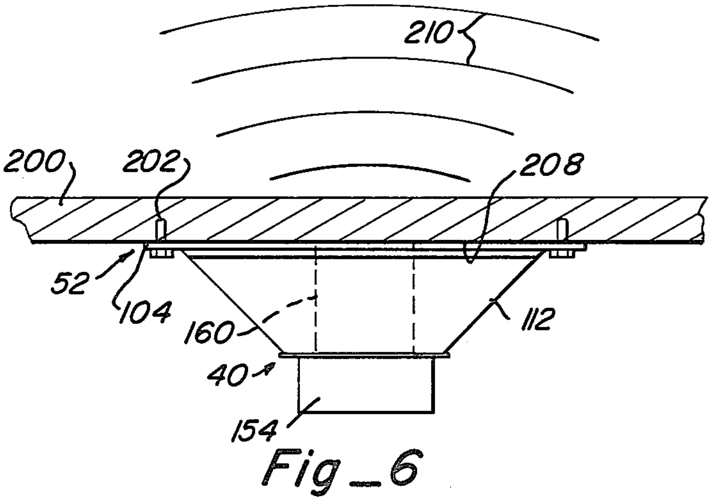
FIG. 6 is another embodiment in which a speaker is firmly biased to the structural member against a connecting rod.

In FIG. 6, there is shown a transfer means 52 which is adaptable for use on a structural member 200 having a low mass. In this embodiment, the speaker 40 is directly mounted to the structural member 200 by means of attachment studs 202 in the lip region 104 of the speaker 40. The rod 160 is cut to a predetermined length so that the inner surface 208 of the structural member 200 is firmly engaged by one end of the rod 160 and the voice coil 154 of the speaker 40 firmly attaches to the other end of the rod 160. In the same manner as discussed for FIG. 5, through the interaction of both acoustic and mechanical vibration of the structural member 200 omnidirectional waves 210 are generated into the room of the building.

Figure 7:
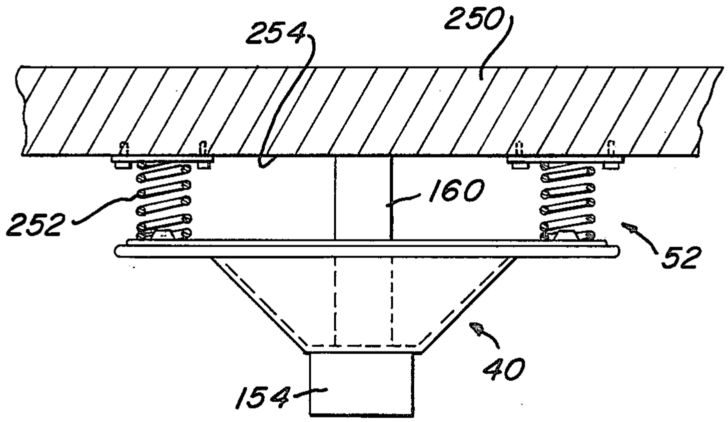
FIG. 7 is a side planar view of yet another embodiment of the present invention wherein a speaker biased against a connecting rod by means of springs in accordance with the teachings of the present invention.

In FIG. 7 is shown a transfer means 52 for a structural member 250 which is of high mass. In this arrangement, coil springs 252 are used to mount the speaker 40 to the structural member 250. It is to be understood that since a high mass structural member 250 is being vibrated, significantly more electrical power is being delivered to the speaker 40. By using coil springs 252 to bias the rod 160 against the inner surface 254 of the structural member 250 and against the voice coil 154, no loosening or jarring noises will be generated into the desired room. At high power levels, the use of coil springs coupled to the weight of the speaker 40 as a force generator enables the speaker 40 to effectively drive the structural member 250.

Figure 8:
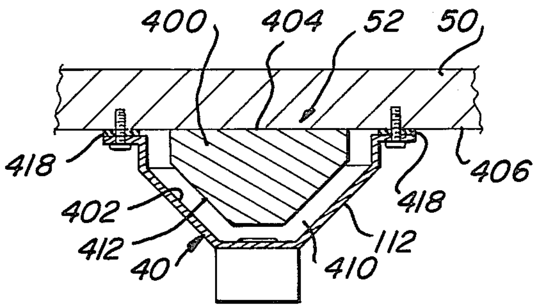
FIG. 8 is a side sectional view of yet another embodiment of the present invention wherein a truncated cone is used in combination with the weight of the speaker to increase vibration of the structural member.
Figure 9:
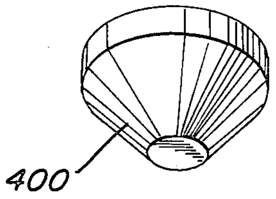
FIG. 9 is a perspective view of the truncated cone of FIG. 8.

In FIG. 8 is disclosed yet another embodiment of speaker 40 and transfer means 52. A truncated cone 400 preferably formed from wood or the like is shown to substantially conform to the inner shape 402 of the diaphragm 112 of speaker 40. The base 404 of the cone 400 is glued or otherwise firmly affixed to the surface 406 of the structural member 50. An air space 410 is defined between the surface 402 of the diaphragm 112 and the surface 412 of the cone 400. The air space 410 is sealed from the environment outside of the speaker 40 by a silicon sealing material 418. In this manner, the air trapped in space 410 serves as a spring having a high spring constant. A high compliance between the vibrating diaphragm 112 and the surface 412 of the cone 400 is thereby achieved maximizing the vibration of the structual member 50 by the speaker 40. A more detailed view of the cone 400 is shown in FIG. 9.

By using any of the disclosed embodiments, a conventional and highly reliable diaphragm speaker can be used to impart vibration to a structural member of a building. In addition, through use of a spectrum shaper, the transfer characteristics of the structural member can be compensated for.

Although the present invention has been described with a certain degree of particularity, it is understood that the present disclosure has been made by way of example and that changes in detail of the structure may be made without departing from the spirit thereof.

We claim:

1. A system for delivering masking noise into an area, said area containing a plurality of structural members in close association therewith, said system having means for generating electrical masking noise signals and a diaphragm speaker for converting said electrical signals into acoustical waves, said system comprising:

means for supporting the opening of said speaker in close spaced relation to the surface of said member, and means affixed to said member and in spaced relation to the sides of the inverted conical surface of the diaphragm of said speaker for enhancing the compliance of the air between the diaphragm and said member so that said acoustical waves impart greater vibration to said member.

2. The system of claim 1 wherein said diaphragm speaker further comprises means between said speaker and said member for sealing the air between said diaphragm and said member.

3. A system for delivering masking noise into adjacent rooms, said adjacent rooms having a separation space between the adjoining walls of each of said rooms, and means for generating masking noise, said system comprising: means in said separation space receptive of said masking noise for vibrating both of said adjoining walls so that said masking noise is extended into said adjacent rooms.

4. The system of claim 3 wherein said vibrating means comprises a diaphragm speaker.

5. The system of claim 4 further comprising:

means for connecting the end of the speaker opposite said diaphragm to one of said walls, and means affixed to the opposing wall and to the end of said voice coil in the opening end of said diaphragm for extending the mechanical vibration of said voice coil into said structure.

6. A transducer responsive to electrical signals representative of sound for vibrating a structural member of a building so that said sound is extended from said vibrating member into said building, said transducer comprising:

a substantially inverted truncated cone, the base of said cone being affixed to the surface of said member and the truncated end being disposed outwardly from said surface, a diaphragm speaker, the opening end of the diaphragm of said speaker being disposed over said truncated end so that the sides of said diaphragm are in close parallel spaced relation to the surface of said truncated cone, and means connected to said speaker and to said member for holding said speaker over said truncated cone.

7. The transducer of claim 6 wherein said holding means further comprises means between said speaker and said member for substantially sealing the air between said diaphragm and said truncated cone.

* * * * *